United States Patent

Trompenaars et al.

(10) Patent No.: US 6,462,332 B1
(45) Date of Patent: Oct. 8, 2002

(54) PARTICLE OPTICAL APPARATUS

(75) Inventors: Petrus Hubertus Franciscus Trompenaars; Bernardus Hendrikus Wilhelmus Hendriks, both of Eindhoven; Jarig Politiek, Baarn, all of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 126 days.

(21) Appl. No.: 09/689,059

(22) Filed: Oct. 12, 2000

(30) Foreign Application Priority Data

Oct. 15, 1999 (EP) .............................................. 99203394

(51) Int. Cl.[7] .............................. H01S 1/00; H01J 37/30; H05H 3/00
(52) U.S. Cl. ................................... 250/251; 250/492.21
(58) Field of Search ........................ 250/251, 492.21, 250/398

(56) References Cited

U.S. PATENT DOCUMENTS 5,633,506 A * 5/1997 Blake ........................ 250/251
5,864,143 A * 1/1999 Ueda et al. ............. 250/492.21
6,140,025 A * 8/2000 Tokiguchi et al. .......... 250/251

OTHER PUBLICATIONS

Japanese Abstract 62–98548, "Ion Implantation Device", dated Oct. 24, 1985.

* cited by examiner

Primary Examiner—Bruce Anderson

(57) ABSTRACT

A particle optical apparatus, such as an ion implantation apparatus, an Auger electron spectrometer, an XPS analysis apparatus, and the like, is provided with a radiation source by means of which a wafer or substrate brought into the apparatus can be bombarded by radiation providing for at least a positively charged surface layer of the wafer or substrate. The apparatus further comprises a charge neutralization device with means for providing secondary electron emission and transport means for transporting secondary electrons. This transport means device is provided with a hollow insulating structure for controlled electron transport based on secondary electron emission, particularly in the form of an electron fibre with electrodes at the entrance and exit. The exit of the electron fibre forms a clean secondary electron source.

4 Claims, 2 Drawing Sheets

PARTICLE OPTICAL APPARATUS

FIELD OF THE INVENTION

The present invention relates to a particle optical apparatus, such as an ion implantation apparatus, an Auger electron spectrometer, an XPS analysis apparatus, and the like, with a radiation source by means of which a wafer or substrate brought into the apparatus can be bombarded by radiation providing for at least a positively charged surface layer of the wafer or substrate, the apparatus further comprising a charge neutralization device with means for providing secondary electron emission and transport means for transporting secondary electrons. In case of an ion implantation apparatus an ion source is present by means of which a wafer or substrate can be bombarded by positively charged particles. In case of an Auger electron spectrometer an electron source is present by means of which a wafer or substrate can be bombarded by electrons. In case of an XPS analysis apparatus an X-ray source is present by means of which a wafer or substrate can be bombarded by X-rays. In all these cases a charge neutralization device with means for providing secondary electron emission and transport means for transporting secondary electrons will be present.

DESCRIPTION OF PRIOR ART

A particle optical apparatus as described in the preamble is known from e.g. JPA-62.98548 and JP-A-03.25846.

The means for providing secondary electron emission comprises an electron source for generating primary electrons of relatively high energy, by means of which in a secondary electron generating box secondary electrons of relatively low energy are generated. Although in JP-A-62.98548 the secondary electron generating box is designed to prevent the primary electrons from directly reaching a wafer or substrate in the particle optical apparatus, a certain contamination of the secondary electrons with high energy primary electrons will always occur. Such a contamination can damage the wafer or substrate. For this reason it is often necessary to place the contaminated secondary electron source not too close to the wafer or substrate, which, however, leads to an insufficiently controlled implantation process.

SUMMARY OF THE INVENTION

The purpose of the invention is to obviate or at least to mitigate the above disadvantage and to provide for a particle optical apparatus in which the contamination of the secondary electrons with high energy primary electrons is further reduced.

According to the invention, the particle optical apparatus as described in the opening paragraph is characterized in that the charge neutralization device is provided with a hollow insulating structure for controlled electron transport based on secondary electron emission. Particularly the hollow insulating structure is an electron duct in vacuum with electrodes at the entrance and exit by means of which the necessary transport field in the duct is realized. Contamination originating from the primary electron source, mostly formed by a thermionic cathode and consisting of material that evaporates from the cathode, such as barium or tungsten, are absorbed in the electron duct, so that the exit thereof can be considered as a clean electron source. Furthermore, high energy primary electrons entering the electron duct loose most of their energy and will not reach the exit of the-duct, so that at the exit of the duct only secondary electrons are emitted. So, the exit of the duct cannot only be considered as a clean electron source but indeed as a clean secondary electron source. For these reasons and because the electron duct can be shaped in almost every form, the exit of the electron duct can be put into the vicinity of the location where a wafer or substrate can be brought into the apparatus without this secondary electron source causing any deterioration thereof. A secondary electron source in the vicinity of the wafer or substrate opens the possibility to flood the wafer or substrate with electrons having a reduced kinetic energy, thus practically preventing damaging the wafer or substrate.

The invention not only relates to a particle optical apparatus, but also to a charge neutralization device with a hollow insulating structure for controlled electron transport based on secondary electron emission for application in a particle optical apparatus as described above.

The invention, particularly the ion implantation apparatus, may be applied for the manufacture of semiconductors, SIMM's (single-in-line memory modules), etc.

BRIEF DESCRIPTION OF THE DRAWING

Now, the invention will be explained in more detail with reference to the accompanying drawing, in which.

DETAILED DESCRIPTION OF THE PREFERRED EMBODIMENT

Figure 1:
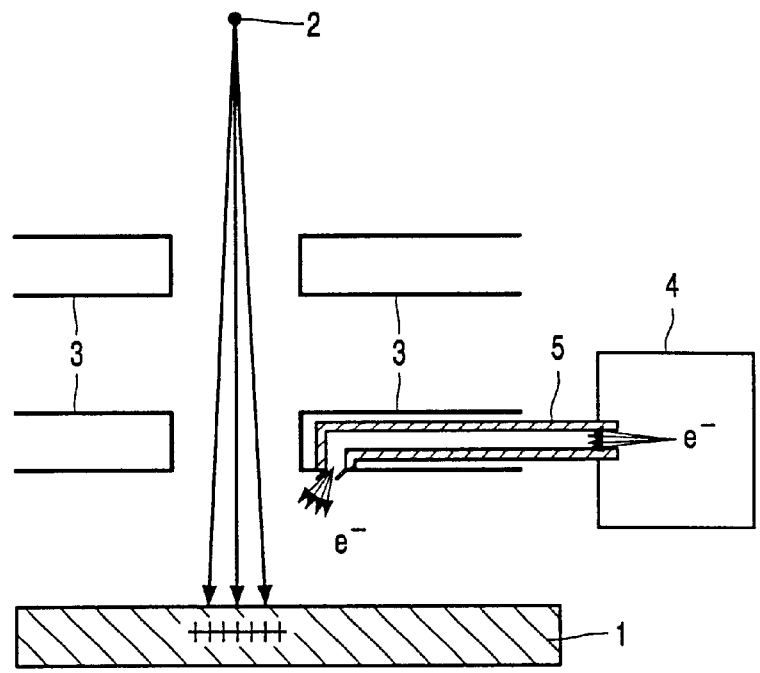
FIG. 1 shows a schematic arrangement of an ion implantation apparatus with a charge neutralization device according to the invention.

FIG. 1 shows schematically an ion implantation apparatus in which a positively charged Si semiconductor-substrate 1 for IC fabrication is brought. By means of an ion source 2 ions are brought in the substrate. To focus the ions on the substrate 1 electrodes 3 are present. During the ion implantation process the Si-substrate becomes positively charged. For stable operation of the ion implantation apparatus, this charge must be neutralized continuously. For this purpose the ion implantation apparatus comprises means 4 for providing secondary electron emission and transport means for transporting secondary electrons in the form of a hollow insulating structure, particularly an electron duct 5, which in the embodiment of FIG. 1 is arranged within one of the electrodes 3. As any known type of means for generating primary and secondary electrons can be used, these means are not further described. The electrons must be led to the entrance of the electron duct 5. In the present embodiment the entrance of the electron duct is brought on a negative voltage, the value thereof being dependent on the geometry and material properties of the duct and being such that a sufficient transport field in the duct will be obtained. The exit of the duct is set to 0V with respect to the substrate. The ion source 2, the electrodes 3, and at least the exit end of the electron duct 5 are mounted within a vacuum chamber; the substrate is brought in said vacuum chamber. The substrate to be locally sprinkled with electrons is assumed to have acquired on that location a positive potential, corresponding with the maximum landing energy energy of the electrons on the substrate as shown by uninterrupted lines in FIGS. 2A and 2B.

Figure 3:
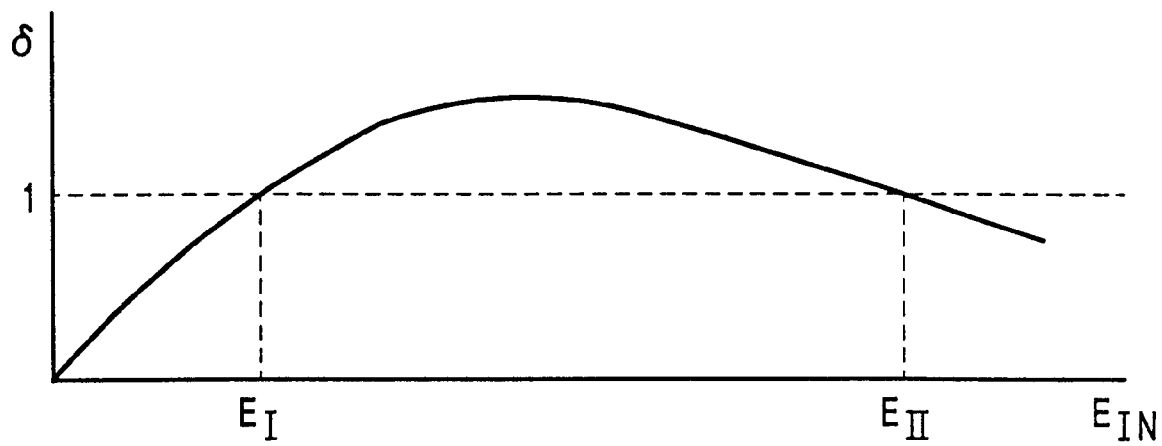
FIG. 3 shows the secondary electron yield curve.
Figure 4:
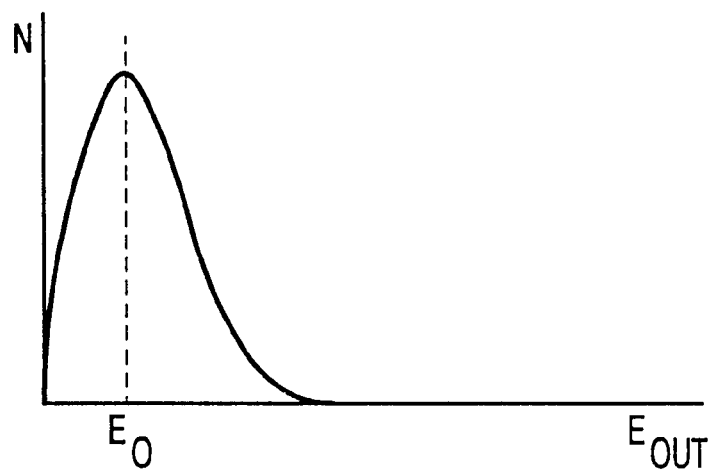
FIG. 4 shows the secondary electron energy distribution.

When the substrate is positively charged with respect to the ducts's exit, electrons emerging from the duct hit the substrate and lead to secondary electron generation. FIG. 3 shows the secondary electron yield curve, i.e. the secondary electron emission coefficient δ as a function of the energy of the electrons hitting the substrate. Below the value δ=1, thus when the energy of the electrons hitting the substrate is less than $E_I$ or higher than $E_{II}$ less electrons are emitted from the substrate than are hitting the substrate. Above the value δ=1, more electrons are emitted from the substrate than are hitting the substrate. As, to prevent damaging of the substrate, the energy of the electrons hitting the substrate will be small; the maximum value of δ will not be reached in the presently described discharging process. In FIG. 4 the energy distribution of secondary electrons emitted from the substrate is shown. A typical value for $E_0$ is: 1 to 5 eV, for $E_I$: 5 to 20 eV The dynamics of the discharging process is as follows. Since the potential of the substrate is higher than the potential of the surrounding electrodes, secondary electrons emitted from the substrate are recaptured by the substrate and provide for a charge displacement on the substrate. Hence the potential of at least the surface of the substrate decreases. As soon as the potential of the substrate becomes lower than the potential of the surrounding electrodes two cases can arise. First, electrons emerging from the duct hit the substrate with kinetic energies which are lower than the energy value $E_I$ of the secondary electron yield curve of the substrate (see FIG. 3). These electrons cause the substrate to be charged negatively, until none of the electrons from the duct can reach the substrate anymore. Second, electrons emerging from the duct can hit the substrate with kinetic energies which are larger than the energy value $E_I$ of the secondary electron yield curve of the substrate, but lower than $E_{II}$. These electrons cause the substrate to charge positively. The surplus of generated secondary electrons are captured by the surrounding electrodes because these have a higher potential than the substrate. The charging stops when the potential of the substrate becomes equal to that of the surrounding electrodes, because further positive charging would lead to recapturing of the secondary electrons emitted from the substrate by the substrate.

Figure 2A:
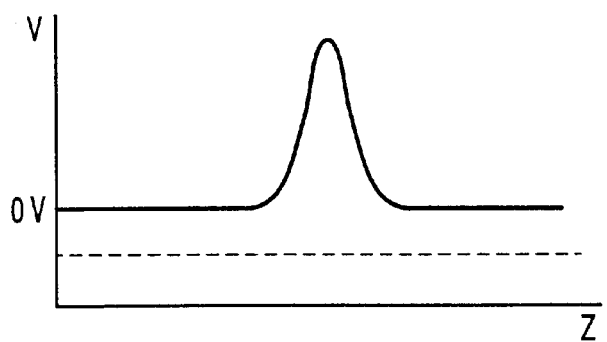
FIGS. 2A and 2B show potential distributions in one direction of the substrate before and after charge neutralization.

Consequently, there are two ways to discharge the substrate:

- Using an electron beam with low kinetic energy, i.e. low in comparison with the energy value $E_I$, in which case the substrate becomes negatively charged, such that none of these electrons can reach the substrate anymore, indicated by the interrupted line in FIG. 2A;
- Using an electron beam with kinetic energy which is larger than the energy value $E_I$, but lower than $E_{II}$. The potential distribution of the substrate becomes than practically equal to that of the surrounding electrodes, indicated by the interrupted line in FIG. 2B.

Figure 2B:
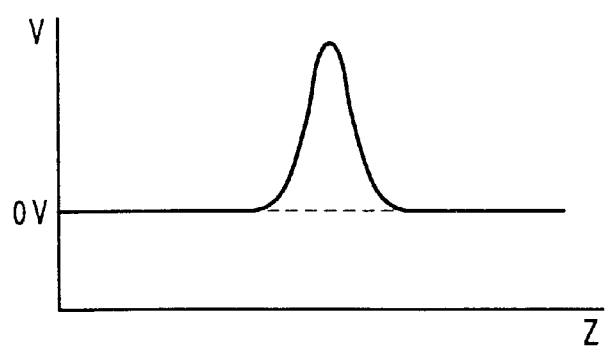

For both cases FIGS. 2A and 2B respectively show the potential distribution in one direction (Z-direction) of the substrate before and after charge neutralization.

In practice both processes occur. The steady state potential distribution along the substrate stabilizes somewhere in between the two extreme cases, illustrated in FIGS. 2A and 2B.

What is claimed is:

1. Particle optical apparatus, such as an ion implantation apparatus, an Auger electron spectrometer, an XPS analysis apparatus, and the like, with a radiation source by means of which a wafer or substrate brought into the apparatus can be bombarded by radiation providing for at least a positively charged surface layer of the wafer or substrate, the apparatus further comprising a charge neutralization device with means for providing secondary electron emission and transport means for transporting secondary electrons, characterized in that the charge neutralization device is provided with a hollow insulating structure for controlled electron transport based on secondary electron emission.

2. Particle optical apparatus according to claim 1, characterized in that the hollow insulating structure is an electron duct in vacuum with electrodes at the entrance and exit thereof.

3. Particle optical apparatus according to claim 2, characterized in that the exit of the hollow insulating structure is brought in the vicinity of the location where the wafer or substrate can be placed into the apparatus.

4. Charge neutralization device with a hollow insulating structure for controlled electron transport based on secondary electron emission for application in a particle optical apparatus according to claim 1.

* * * * *